US008659963B2

(12) United States Patent
Dengler et al.

(10) Patent No.: US 8,659,963 B2
(45) Date of Patent: Feb. 25, 2014

(54) ENHANCED POWER SAVINGS FOR MEMORY ARRAYS

(75) Inventors: Osama Dengler, Boeblingen (DE); Stefan Payer, Nurtingen (DE); Philipp Salz, Altdorf (DE); Rolf Sautter, Bondorf (DE)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 13/343,996

(22) Filed: Jan. 5, 2012

(65) Prior Publication Data
US 2013/0176795 A1 Jul. 11, 2013

(51) Int. Cl.
G11C 7/00 (2006.01)

(52) U.S. Cl.
USPC .......................................... 365/203

(58) Field of Classification Search
USPC .......................................... 365/203
See application file for complete search history.

(56) References Cited

U.S. PATENT DOCUMENTS

| 6,288,959 | B1 | 9/2001 | Ou Yang et al. |
| 6,292,401 | B1 | 9/2001 | Zhang et al. |
| 6,529,412 | B1 | 3/2003 | Pau-Ling et al. |
| 6,711,051 | B1 | 3/2004 | Poplevine et al. |
| 7,154,795 | B2 | 12/2006 | Parris et al. |
| 7,167,385 | B2 | 1/2007 | Chan et al. |
| 7,209,399 | B2 | 4/2007 | Chun et al. |
| 7,936,624 | B2 | 5/2011 | Clinton |
| 7,965,570 | B2 | 6/2011 | Wilson et al. |
| 2007/0153604 | A1 | 7/2007 | Tsao et al. |
| 2007/0201298 | A1 | 8/2007 | Ramaraju |
| 2008/0112234 | A1 | 5/2008 | Tokito |
| 2009/0046494 | A1 | 2/2009 | Takahashi |
| 2009/0141570 | A1 | 6/2009 | Hsu et al. |
| 2009/0175107 | A1 | 7/2009 | Christensen et al. |
| 2012/0275236 | A1* | 11/2012 | Hess et al. ............... 365/189.02 |

FOREIGN PATENT DOCUMENTS

WO WO2007/076503 A2 7/2007

OTHER PUBLICATIONS

Panda, Preeti R. et al., "Power-Efficient Memory and Cache", http://www.springerlink.com/content/pl13j0221300803w/, Abstract only, 2010, 2 pages.

Zyuban, V. et al., "Power Optimization Methodology for the IBM Power7 Microprocessor", IBM Corporation, IBM Journal of Research and Development, Abstract only, vol. 55, Issue 3, May-Jun. 2011, 1 page.

Notification of Transmittal of the International Search Report and the Written Opinion of the International Searching Authority, or the Declaration dated May 2, 2013, International Application No. PCT/IB2012/057058, 11 pages.

* cited by examiner

Primary Examiner — Hoai V Ho
(74) Attorney, Agent, or Firm — Francis Lammes; Stephen J. Walder, Jr.; Matthew B. Talpis

(57) ABSTRACT

A memory array is provided that comprises a plurality of global bit lines such that each bit line is coupled to a plurality of memory cells. The memory array further comprises a plurality of precharge logic such that each precharge logic is coupled to an associated global bit line in the plurality of global bit lines. Identification logic in the memory array is coupled to the plurality of precharge logic. The identification logic provides a precharge enable signal to a subset of the plurality of precharge logic on each clock cycle such that the subset of precharge logic precharges its associated subset of global bit lines to a voltage level of a voltage source, thereby reducing the power consumption of the memory array.

18 Claims, 6 Drawing Sheets

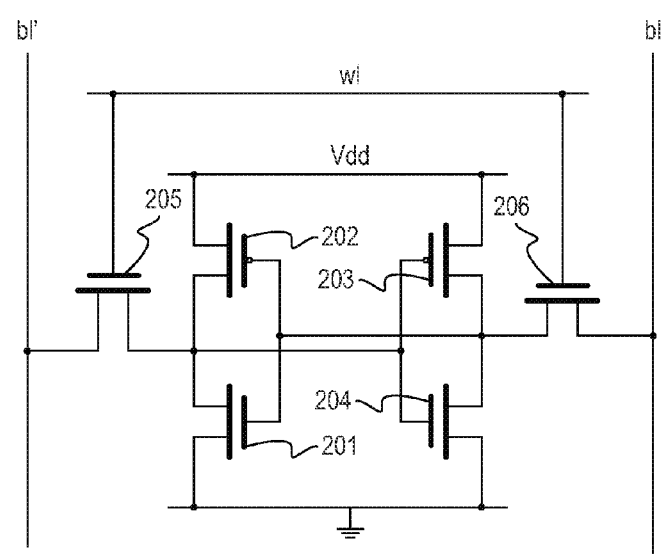
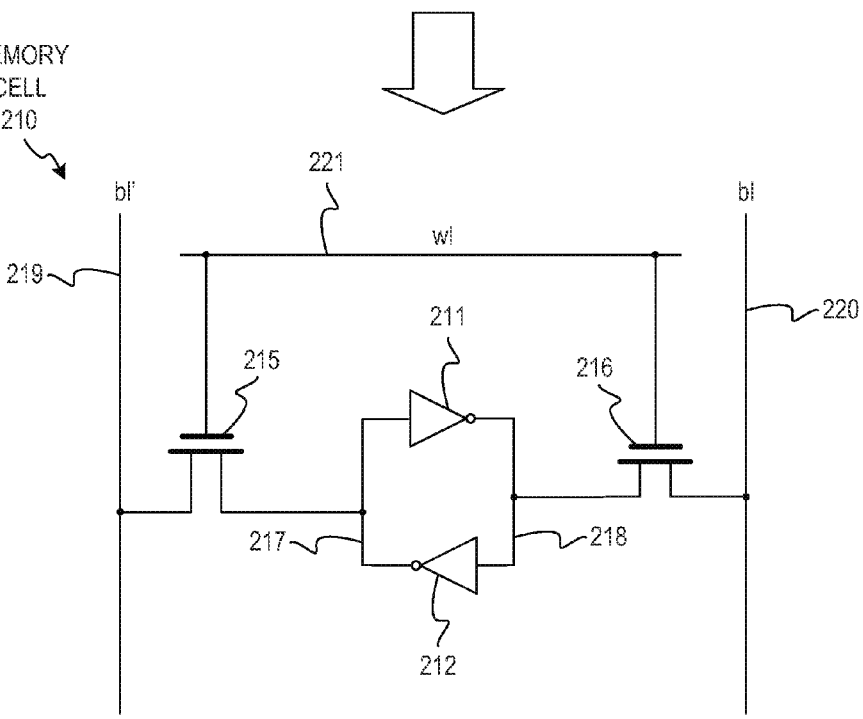
FIG. 2

ENHANCED POWER SAVINGS FOR MEMORY ARRAYS

BACKGROUND

The present application relates generally to an improved data processing apparatus and method and more specifically to mechanisms for enhanced power savings in memory arrays.

Static random access memory (SRAM) is a type of volatile digital memory that retains data written to it so long as power is applied to the SRAM. One type of SRAM commonly used in high performance computational circuits is referred to as a "domino" SRAM.

As will be appreciated by those skilled in the art, in prior art domino SRAM designs, the cells are arranged into groups of cells, typically on the order of eight to sixteen cells per group. Each cell in a group is connected to a local bit line pair and the local bit line pair for each group of cells is coupled to a global bit line pair. Rather than use a sense amplifier to detect a differential voltage when reading a cell, in a ripple domino read SRAM scheme the local bit lines are discharged by the cell in a read operation. When a discharge is detected, a state of the cell may then be determined.

SUMMARY

In one illustrative embodiment, a memory array is provided. In the illustrative embodiment, the memory array comprises a plurality of global bit lines, where each bit line is coupled to a plurality of memory cells. In the illustrative embodiment, the memory array comprises a plurality of precharge logic, where each precharge logic is coupled to an associated global bit line in the plurality of global bit lines. In the illustrative embodiment, the memory array comprises identification logic coupled to the plurality precharge logic. In the illustrative embodiment, the identification logic provides a precharge enable signal that enables a subset of the plurality of precharge logic to precharge its associated subset of global bit lines to a voltage level of a voltage source. In the illustrative embodiment, the identification logic sends the precharge enable signal to the subset of precharge logic of the plurality of precharge logic on each clock cycle, thereby reducing the power consumption of the memory array.

In another illustrative embodiment, an integrated chip is provided that comprises a memory array. In the illustrative embodiment, the memory array comprises a plurality of global bit lines, where each bit line is coupled to a plurality of memory cells. In the illustrative embodiment, the memory array comprises a plurality of precharge logic, where each precharge logic is coupled to an associated global bit line in the plurality of global bit lines. In the illustrative embodiment, the memory array comprises identification logic coupled to the plurality of precharge logic. In the illustrative embodiment, the identification logic provides a precharge enable signal that enables a subset of the plurality of precharge logic to precharge its associated subset of global bit lines to a voltage level of a voltage source. In the illustrative embodiment, the identification logic sends the precharge enable signal to the subset of precharge logic of the plurality of precharge logic on each clock cycle, thereby reducing the power consumption of the memory array.

In yet another illustrative embodiment, a data processing system is provided that comprises a processor and a memory coupled to the processor. The memory comprises a memory array and the memory array comprises a plurality of global bit lines, where each bit line is coupled to a plurality of memory cells. In the illustrative embodiment, the memory array comprises a plurality of precharge logic, where each precharge logic is coupled to an associated global bit line in the plurality of global bit lines. In the illustrative embodiment, the memory array comprises identification logic coupled to the plurality of precharge logic. In the illustrative embodiment, the identification logic provides a precharge enable signal that enables a subset of the plurality of precharge logic to precharge its associated subset of global bit lines to a voltage level of a voltage source. In the illustrative embodiment, the identification logic only sends the precharge enable signal to the subset precharge logic of the plurality of precharge logic on each clock cycle, thereby reducing the power consumption of the memory array.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 2 depicts an example of a conventional 6 transistor (6T) memory cell in accordance with an illustrative embodiment;

DETAILED DESCRIPTION

The illustrative embodiments provide a circuit arrangement for reducing power consumption in an array system of SRAM cells that addresses shortcomings of prior art array systems of SRAM cells and SRAM devices, thereby enhancing power savings in memory arrays.

Figure 1:
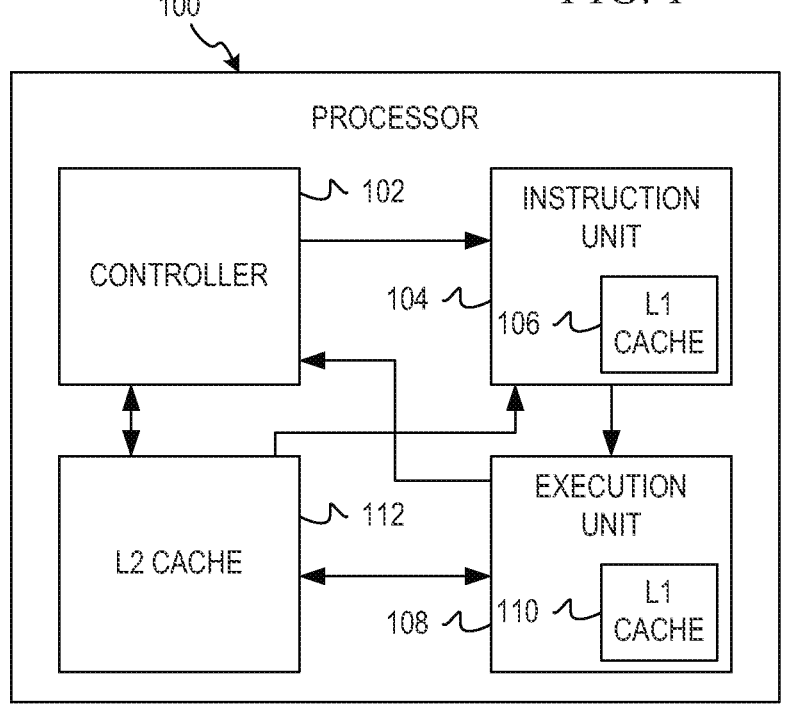
FIG. 1 is an exemplary block diagram of a processor in accordance with an illustrative embodiment.

FIG. 1 is provided as one example of a data processing environment in which a cache memory array may be utilized, i.e. in a cache of a processor. FIG. 1 is only offered as an example data processing environment in which the aspects of the illustrative embodiments may be implemented and is not intended to state or imply any limitation with regard to the types of, or configurations of, data processing environments in which the illustrative embodiments may be used. To the contrary, any environment in which a cache memory array may be utilized is intended to be within the spirit and scope of the present invention.

FIG. 1 is an exemplary block diagram of processor 100 in accordance with an illustrative embodiment. Processor 100 includes controller 102, which controls the flow of instructions and data into and out of processor 100. Controller 102 sends control signals to instruction unit 104, which includes L1 cache 106. Instruction unit 104 issues instructions to execution unit 108, which also includes L1 cache 110. Execution unit 108 executes the instructions and holds or forwards any resulting data results to, for example, L2 cache 112 or controller 102. In turn, execution unit 108 retrieves data from L2 cache 112 as appropriate. Instruction unit 104 also retrieves instructions from L2 cache 112 when necessary. Controller 102 sends control signals to control storage or retrieval of data from L2 cache 112. Processor 100 may contain additional components not shown, and is merely provided as a basic representation of a processor and does not limit the scope of the present invention. Although, FIG. 1 depicts only level 1 (L1) cache and Level 2 (L2) cache, the illustrative embodiments are not limited to only these levels of memory hierarchy. That is, the illustrative embodiments may be applied to any level of memory hierarchy without departing from the spirit and scope of the invention.

Those of ordinary skill in the art will appreciate that the hardware in FIG. 1 may vary depending on the implementation. Other internal hardware or peripheral devices, such as flash memory, equivalent non-volatile memory, or optical disk drives and the like, may be used in addition to or in place of the hardware depicted in FIG. 1. Also, the processes of the illustrative embodiments may be applied to a multiprocessor data processing system, without departing from the spirit and scope of the present invention.

Moreover, the data processing system 100 may take the form of any of a number of different data processing systems including client computing devices, server computing devices, a tablet computer, laptop computer, telephone or other communication device, a personal digital assistant (PDA), or the like. In some illustrative examples, data processing system 100 may be a portable computing device which is configured with flash memory to provide non-volatile memory for storing operating system files and/or user-generated data, for example. Essentially, data processing system 100 may be any known or later developed data processing system without architectural limitation.

FIG. 2 depicts an example of a conventional 6 transistor (6T) memory cell in accordance with an illustrative embodiment. Memory cell 200 forms the basis for most static random-access memories (SRAM) in complementary metal oxide semiconductor (CMOS) technology. Memory cell 200 uses six transistors 201-206 to store and access one bit. Transistors 201-204 in the center form two cross-coupled inverters, which is illustrated in the more simplified memory cell 210 comprising inverters 211 and 212. Due to the feedback structure created by inverters 211 and 212, a low input value on inverter 211 will generate a high value on inverter 212, which amplifies (and stores) the low value on inverter 212. Similarly, a high input value on inverter 211 will generate a low input value on inverter 212, which feeds back the low input value onto inverter 211. Therefore, inverters 211 and 212 will store their current logical value, whatever value that is.

Lines 217 and 218 between inverters 211 and 212 are coupled to separate bit-lines 219 and 220 via two n-channel pass-transistors 215 and 216. The gates of transistors 215 and 216 are driven by word line 221. In a memory array, word line 221 is used to address and enable all bits of one memory word. As long as word line 221 is kept low, memory cell 210 is decoupled from bit-lines 219 and 220. Inverters 211 and 212 keep feeding themselves and memory cell 210 stores its current value.

When word line 221 is high, both transistors 215 and 216 are conducting and connect the inputs and outputs of inverters 211 and 212 to bit-lines 219 and 220. That is, inverters 211 and 212 drive the current data value stored inside the memory cell 210 onto bit-line 219 and the inverted data value onto inverted bit-line 220. To write new data into memory cell 210, word line 221 is activated and, depending on the current value stored inside memory cell 210, there might be a short-circuit condition and the value inside memory cell 210 is literally overwritten. This only works because transistors 202-203 are very weak. That is, transistors 202-203 are considered weak because when new data is to be written to transistors 201-204, the current state of transistors 201-204 may be easily overridden with the new state.

The majority of the power dissipated in cache memory arrays comes from the pre-charging and discharging of bit-lines during a read access. The bit-lines, such as bit-lines 219 and 220 in FIG. 2, span the entire height of the cache memory array and tend to be highly capacitive and thus introduce stability issues into each memory cell.

Figure 3:
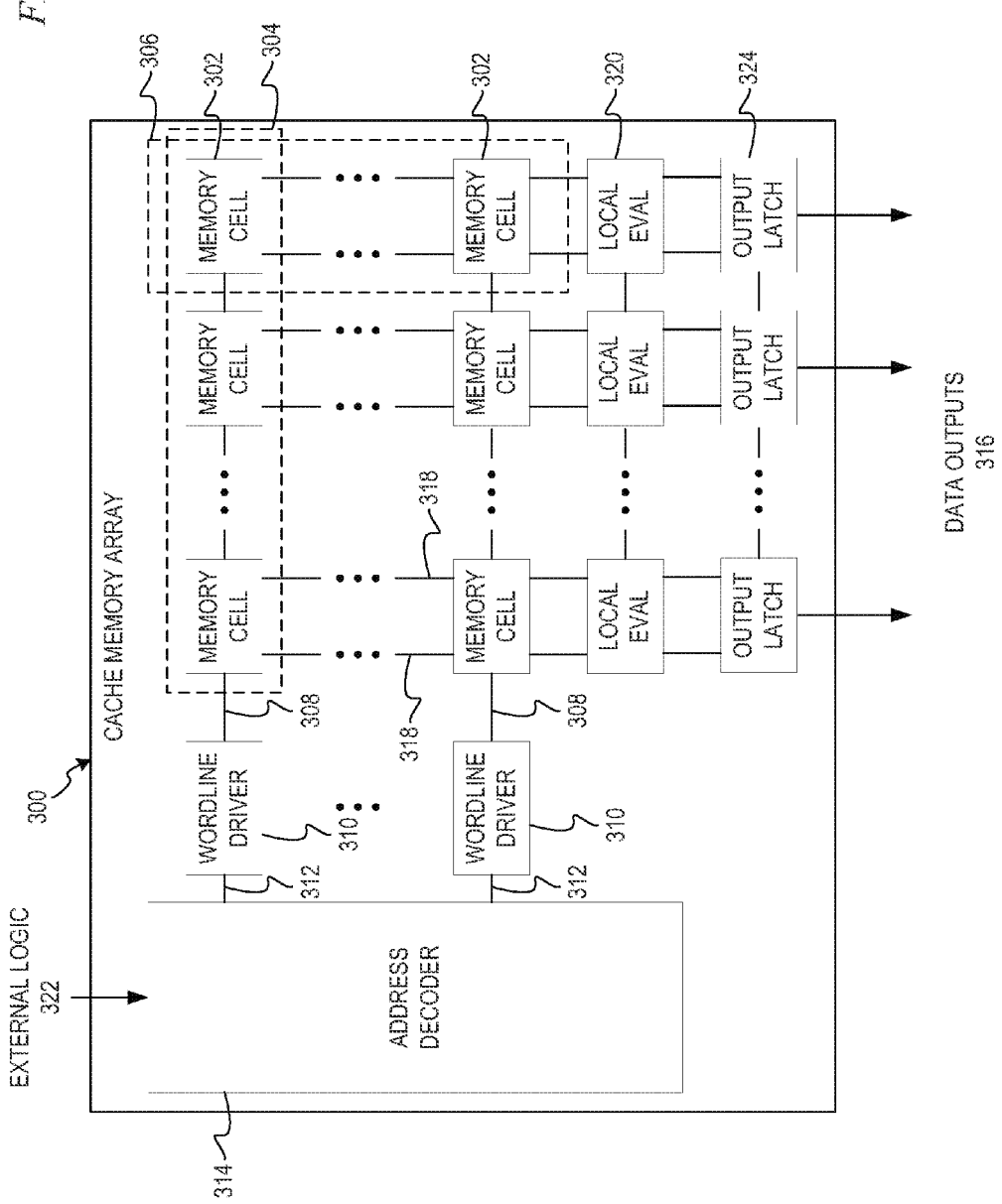
FIG. 3 illustrates a high-level example of a typical cache memory array comprising multiple memory cells in accordance with an illustrative embodiment.

FIG. 3 illustrates a high-level example of a typical cache memory array comprising multiple memory cells in accordance with an illustrative embodiment. Memory array 300 comprises memory cells 302 arranged as an array having rows 304 and columns 306. Memory cells 302 in a particular row 304 are connected to one another by word lines 308. Word lines 308 of each row 304 are also connected to word line drivers 310 which receive output 312 from address decoder 314 that identifies which row 304 is to be output and cache memory array 300 outputs the corresponding data entry through data outputs 316. Word line driver 310 may provide a single word line, such as word line 221 of FIG. 2. Memory cells 302 in a particular column 306 are connected to one another by a pair of local bit lines 318 which are driven to complimentary during write executions and are traditionally precharged to the voltage supply. Bit lines 318 may be true and compliment bit lines, such as true bit line 219 and compliment bit line 220 of FIG. 2. In the ripple domino read scheme of FIG. 3, a read operation starts with address decoder 314 receiving an address associated with a read/write access from external logic 322. Address decoder 314 decodes the address and signals the particular one of word line drivers 310 associated with the decoded address using output 312. The particular one of word line drivers 310 then fires due to the signal from address decoder 314 and word line 308 rises such that the data in the associated row 304 of memory cells 302 is output. Memory cells 302 pull down one of their associated local bit lines 318. Each local bit line 318 is coupled to a local evaluation circuit 320 which acts as an amplifier for the read signal. Therefore the local evaluation circuit 320 comprises amplifier structure to pull down a global bit line gbl' which is a high capacity node due to the long wiring length and the device capacitance of the local evaluation circuit pull-down devices. The value of the data read from each memory cell 302 of the associated row 304 is then latched by output latch 324 before being output through data outputs 316.

Figure 4:
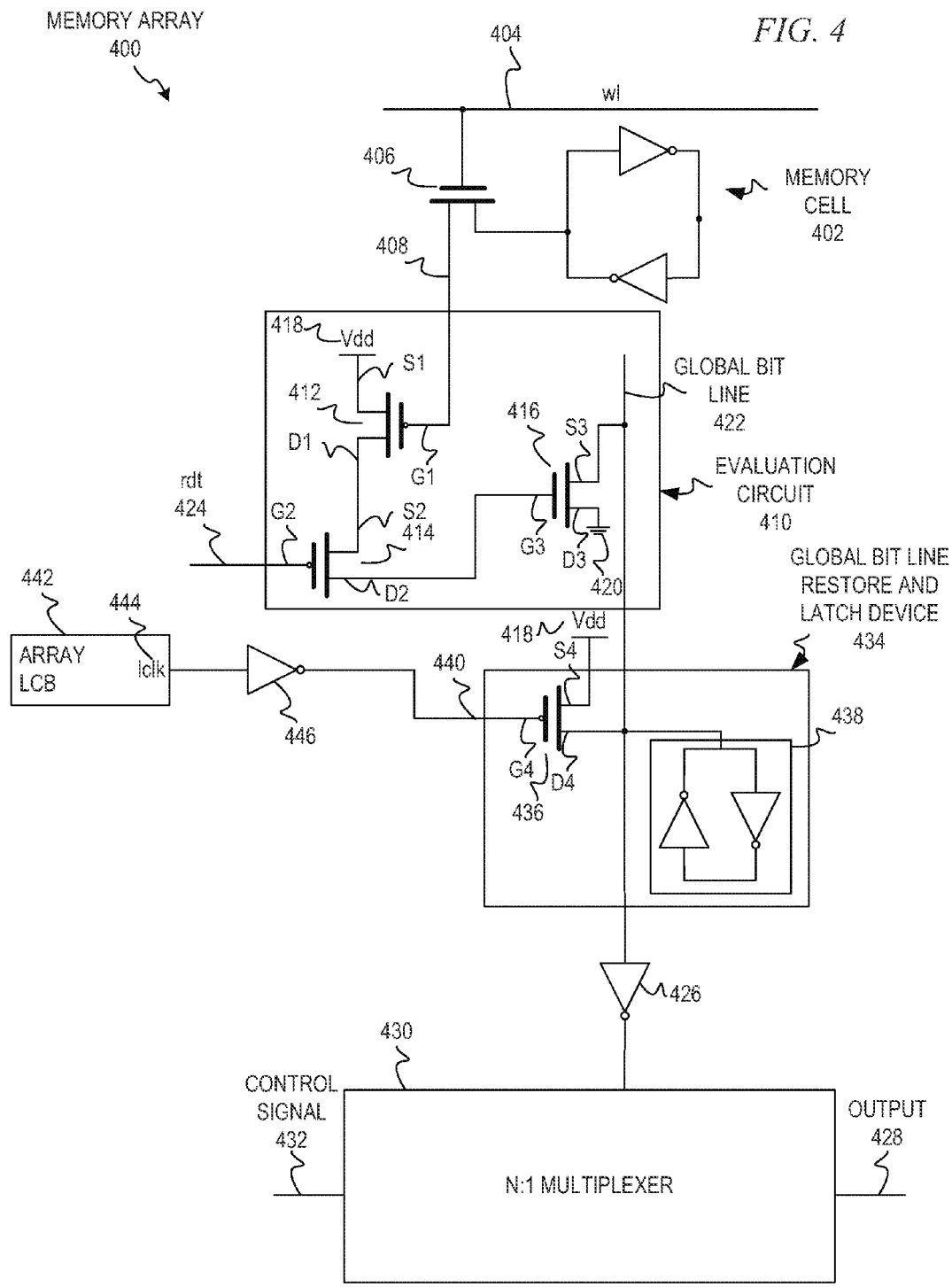
FIG. 4 depicts a ripple domino read scheme of an SRAM cell in accordance with an illustrative embodiment.

FIG. 4 depicts a ripple domino read scheme of an SRAM cell, such as memory cell 210 of FIG. 2 or one of memory cells 302 of FIG. 3, in accordance with an illustrative embodiment. In memory array 400, during a read of memory cell 402, read word line 404 is high, which drives the gate of transistor 406 to pass the value from memory cell 402 onto bl' local bit line 408, such as bl' local bit line 219 of FIG. 2. Evaluation circuit 410, which is coupled to bl' local bit line 408, acts as an amplifier for the read signal of bl' local bit line 408. That is, the elements in evaluation circuit 410 represent only those elements required for a domino read operation and not for other operations such as precharging. Thus, one of ordinary skill in the art will recognize that evaluation circuit 410 may comprise many other elements and does not disclose elements that are not the focus of the present invention.

Evaluation circuit 410 comprises P-Channel Field Effect Transistors (P-FETs) 412 and 414 and N-Channel Field Effect Transistor (N-FET) 416. P-FET transistor 412 includes a gate terminal (G1), a source terminal (S1), and a drain terminal (D1). P-FET transistor 414 includes a gate terminal (G2), a source terminal (S2), and a drain terminal (D2). N-FET transistor 416 includes a gate terminal (G3), a source terminal (S3), and a drain terminal (D3). Gate terminal G1 is electrically coupled to bl' local bit line 408. Source terminal S1 is electrically coupled to voltage source (Vdd) 418. Drain terminal D1 is electrically coupled to source terminal S2. Gate terminal G2 is electrically coupled to a read enable (rdt) signal 424. Drain terminal D2 is electrically coupled to gate terminal G3, drain terminal D3 is electrically coupled to ground 420, and source terminal S3 is electrically coupled to global bit line (gbl') 422.

Thus, in evaluation circuit 410, upon a read of memory cell 402 by word line 404 going high, if the value stored by memory cell 402 is a 0, then the gate of transistor 412 will be high and voltage from Vdd 418 will not pass to transistor 414, and, conversely, if the value stored by memory cell 402 is a 1, then the gate of transistor 412 will be low and voltage from Vdd 418 will pass to transistor 416. Further, if the rdt signal 424 is active, then the gate of transistor 414 will be high and voltage from Vdd 418, if present based on the state of transistor 412, will not pass to transistor 416, and, conversely, if the rdt signal 424 is not active, then the gate of transistor 414 will be low and voltage from Vdd 418, if present based on the state of transistor 412, will pass to transistor 416. If the value received from transistor 414 is a 1, then the gate of transistor 416 will be high, which will cause a discharge to ground 420 and a 0 will be passed onto gbl' 422. Conversely, if the value received from transistor 414 is a 0, then the gate of transistor 416 will be low, which will cause a 1 to be passed onto gbl' 422. Global bit line (gbl') 422, which is a high capacity node due to the long wiring length and the device capacitance of the local evaluation circuit pull-down devices, is the biggest contributor for active and passive power consumption in ripple domino SRAM arrays.

If transistor 416 outputs a 1 onto gbl' 422, inverter 426 will invert the HIGH signal to a LOW signal, which is recognized by any logic downstream as being a '0' from memory cell 402. Conversely, if transistor 416 outputs a 1 onto gbl' 422, inverter 426 will invert the LOW signal to a HIGH signal, which is recognized by any logic downstream as being a '0' from memory cell 402.

Memory cell 402 is just one example of a memory cell in a plurality of memory cells that may be coupled to local bitline 408. Memory cells, such as memory cell 402, coupled to word line 404 are read out all at the same time in spite of the fact that only the information of one memory cell is needed at output 428. In a cache that uses a number N global bit lines gbl', N:1-way multiplexer 430 chooses which global bit line gbl' to read based on control signal 432.

For each global bit lines in the cache, each global bit line is charged every cycle to the level of voltage from Vdd 418. For example, after a read of memory cell 402, global bit line restore and latch device 434 precharges gbl' 422. Global bit line restore and latch device 434 comprises pull-up-PFET 436 and latch 438. P-FET transistor 436 includes a gate terminal (G4), a source terminal (S4), and a drain terminal (D4). In order to precharge gbl' 422, global bit line restore signal 440 which is electrically coupled to gate terminal G4 activates, based on local clock (lclk) signal 444 from array local clock buffer 442, which is inverted through inverter 446, so that voltage from Vdd 418 coupled to source terminal S4 will pass to gbl' 422 which is electrically coupled to drain terminal D4. Once gbl' 422 is precharged, latch 438 latches the signal so that global bit line restore signal 440 may be deactivated. Thus, as is illustrated the precharging of all global bit lines at each cycle and the leakage of transistor 416 when gbl' 422 is precharged are the main contributor to power consumption in the cache.

Figure 5:
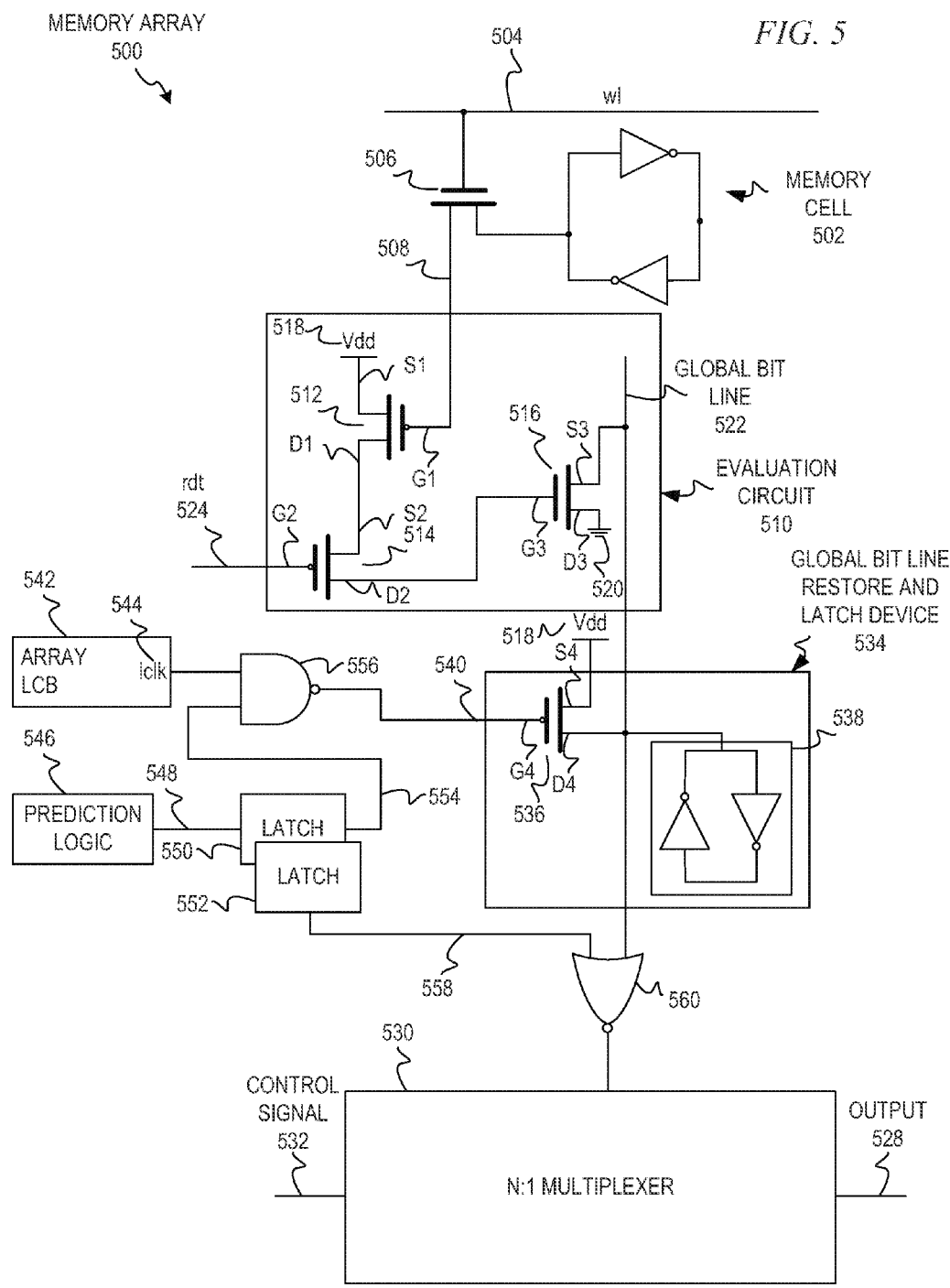
FIG. 5 depicts a ripple domino read scheme of an SRAM cell with additional logic for reducing power consumption normally consumed by precharging of all global bit lines at each cycle in accordance with an illustrative embodiment.

In order to address the precharging of all global bit lines at each cycle, the illustrative embodiments provide logic that reduces power consumption in a memory array system of memory cells. FIG. 5 depicts a ripple domino read scheme of an SRAM cell, such as memory cell 210 of FIG. 2 or one of memory cells 302 of FIG. 3, with additional logic for reducing power consumption normally consumed by precharging of all global bit lines at each cycle in accordance with an illustrative embodiment.

With reference to FIG. 5, memory array 500 includes, in addition to the elements particular to the illustrative embodiments, elements that are similar to elements depicted in memory array 400 of FIG. 4. Thus, elements in FIG. 5 that are not specifically described as operating differently from elements in FIG. 4 are intended to operate in a similar manner as their corresponding elements in FIG. 4. For example, memory array 500 comprises memory cell 502, evaluation circuit 510, N:1-way multiplexer 530, and global bit line restore and latch device 534, as well as elements 504-508, 512-524, 528, 532, 536, 538, 542, and 544, each of which operate in a similar manner to that described with the corresponding elements in FIG. 4.

However, in order to reduce power consumption normally consumed by precharging of all global bit lines at each cycle, only a subset of global bit line restore and latch devices 534, which may also be referred to as precharge logic, activated by the prediction logic 546, precharges a subset of global bit lines gbl' 522. Similar to memory cell 402 of FIG. 4, memory cell 502 is just one example of a memory cell in a plurality of memory cells that may be coupled to bl' local bitline 508. Further, a plurality of evaluation circuits 510 may be coupled to global bit line gbl' 522. Memory cells, such as memory cell 502, coupled to word line 504 are read out all at the same time in spite of the fact that only the information of one memory cell is needed at output 528. In a cache that uses a number N global bit lines gbl', N:1-way multiplexer 530 chooses which global bit line gbl' to read based on control signal 532.

In order to only precharge a respective subset of global bit lines gbl' 522 that are predicted, memory array 500 may, for example, comprise identification logic such as prediction logic 546, which provides early enable signal(s) 548 to master-slave latch set 550 and 552. In this exemplary embodiment, prediction logic 546 is logic that looks for repeating patterns of predictable short loops, which are expected to be seen in the highest power benchmarks, in executed program code. In highest power benchmarks, prediction logic 546 may predict branches in short loops and which global bit lines should be selected later on. Again, memory array 500 only illustrates one memory cell associated with one global bit line. However, as is shown in FIG. 3, there are many global bit lines in a memory array. As one of ordinary skill in the art will recognize there may be many different ways to identify which global bit line to precharge from the plurality of global bit lines. That is, for example, rather than using prediction logic 546 to provide early enable signal(s) 548 to master-slave latch set 550 and 552, memory array 500 may have identification logic that evaluates a highest read address bit or the like.

That is, prediction logic 546 predicts which gbl' will be selected and sends an active "1" early enable signal 548 to the latches, such as master-slave latch set 550 and 552, and sends an inactive "0" to all of the other latches. In case there is a miss and the prediction logic does not know which global bit line will be selected, prediction logic 546 sends an active "1" early enable signal 548 to all latches. While there may be no power savings on a miss, for all other operations, beneficial power savings is provided by not precharging global bit lines that are not predicted.

Thus, if activated by prediction logic 546, master latch 550 provides precharge enable signal L1 554 as an input to NAND gate 556, which replaces inverter 446 of FIG. 4. Master latch 550 provides a scanable boundary in front of memory array 500 in order to observe prediction logic 546 during chip testing. That is, in the configuration shown in FIG. 4, local clock (lclk) signal 444 from array local clock buffer 442 is the global bit line restore signal 440. In memory array 500, precharge enable signal L1 554 is one input to NAND gate 556 and local clock (lclk) signal 544 from array local clock buffer 542 is the other input. Only when precharge enable signal L1 554 and local clock (lclk) signal 544 are active will NAND gate 556 output an active global bit line restore signal 540. Thus, master latch 550 provides a precharge suppression for memory array 500.

Further, if activated by prediction logic 546, slave latch 552 provides precharge enable signal L2 558 as an input to NOR gate 560, which replaces inverter 426 of FIG. 4. Slave latch 552 provides storage of the predicted value constant thought the time where the access to memory array 500 is evaluated. In memory array 500, precharge enable signal L2 558 is one input to NOR gate 560 and global bit line 522 is the other input. When either or both of precharge enable signal L2 558 and global bit line 522 are active, NOR gate 560 will output a 0 to N: 1-way multiplexer 530. However, if both precharge enable signal L2 558 and global bit line 522 are low active, then NOR gate 560 will output a 1 to N: 1-way multiplexer 530. Thus, slave latch 552 and NOR gate 560 provide a force structure for N:1-way multiplexer 530. That is, N:1 multiplexer 530, which is implemented in dynamic logic, requires that the dynamic multiplex input structure return to "0" after each read so that the global bit line gbl' 522 may be precharged. Therefore, NOR gate 560 forces the input to N:1 multiplexer 530 to "0" when either or both of precharge enable signal L2 558 and global bit line 522 are active. As one of ordinary skill in the art will realize, there are many different ways to output the signal from NOR gate 560 to downstream logic coupled to memory array 500. That is, instead of using N:1-way multiplexer 530 as an output device, memory array 500 could, for example, use any type of output device such as coupling the output of NOR gate 560 directly to output 528, coupling the output of NOR gate 560 to other static logic, or the like.

Thus, the additional logic provided in FIG. 5 provides a significant benefit over the state of the art implementation. Since only the selected global bit line gbl' is pulled up to supply voltage, power consumption is reduced by not precharging the remaining global bit lines in the memory array.

Figure 6:
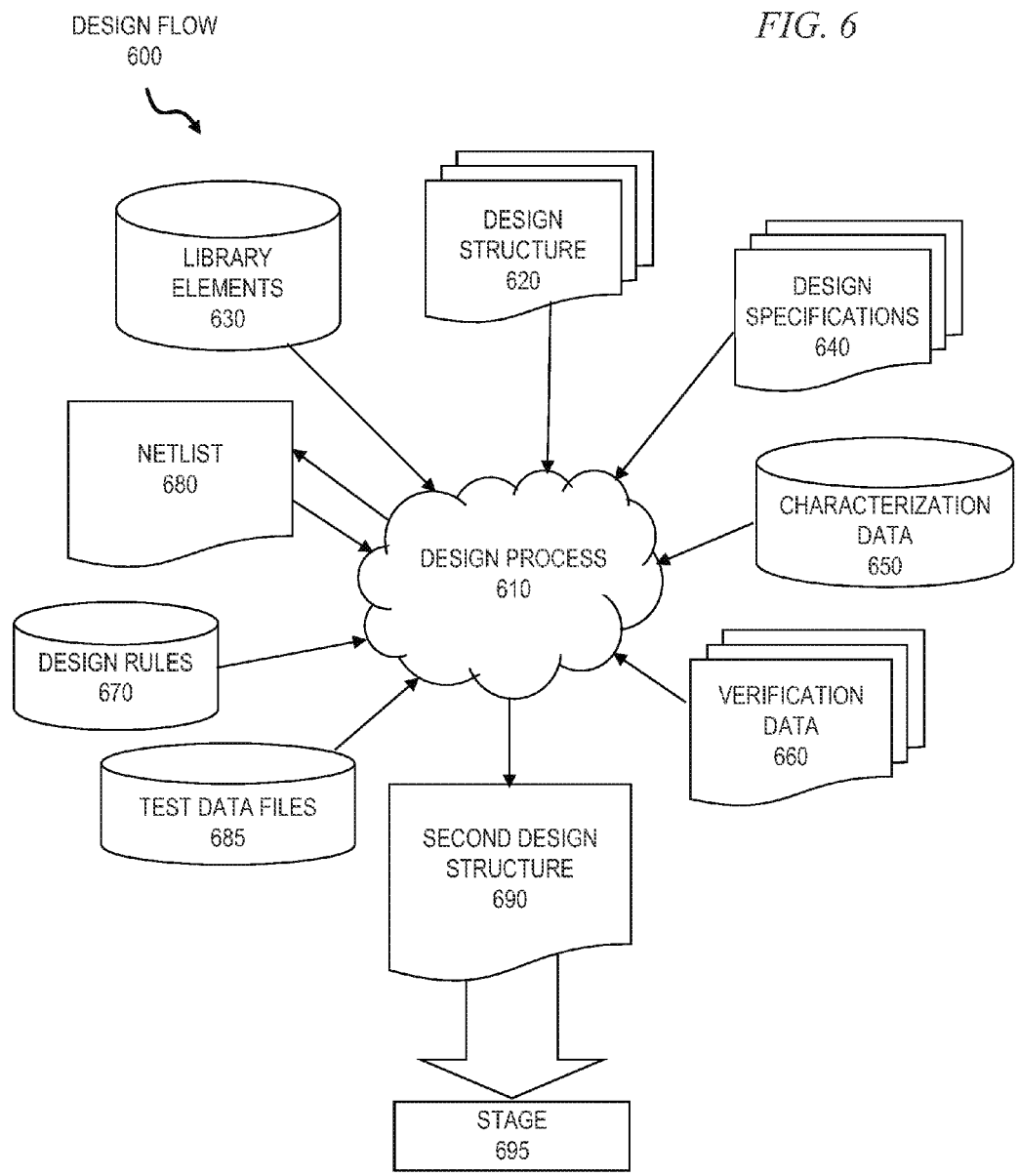
FIG. 6 shows a block diagram of an exemplary design flow used, for example, in semiconductor IC logic design, simulation, test, layout, and manufacture.

FIG. 6 shows a block diagram of an exemplary design flow 600 used, for example, in semiconductor IC logic design, simulation, test, layout, and manufacture. Design flow 600 includes processes and mechanisms for processing design structures to generate logically or otherwise functionally equivalent representations of the embodiments of the invention shown in FIGS. 1-5. The design structures processed and/or generated by design flow 600 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 6 illustrates multiple such design structures including an input design structure 620 that is preferably processed by a design process 610. Design structure 620 may be a logical simulation design structure generated and processed by design process 610 to produce a logically equivalent functional representation of a hardware device. Design structure 620 may also or alternatively comprise data and/or program instructions that when processed by design process 610, generate a functional representation of the physical structure of a hardware device. Whether representing functional and/or structural design features, design structure 620 may be generated using electronic computer-aided design (ECAD) such as implemented by a core developer/designer. When encoded on a machine-readable data transmission or storage medium, design structure 620 may be accessed and processed by one or more hardware and/or software modules within design process 610 to simulate or otherwise functionally represent an electronic component, circuit, electronic or logic module, apparatus, device, or system such as those shown in FIGS. 1-5. As such, design structure 620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 610 preferably employs and incorporates hardware and/or software modules for synthesizing, translating, or otherwise processing a design/simulation functional equivalent of the components, circuits, devices, or logic structures shown in FIGS. 1-5 to generate a netlist 680 which may contain design structures such as design structure 620. Netlist 680 may comprise, for example, compiled or otherwise processed data structures representing a list of wires, discrete components, logic gates, control circuits, I/O devices, models, etc. that describes the connections to other elements and circuits in an integrated circuit design. Netlist 680 may be synthesized using an iterative process in which netlist 680 is resynthesized one or more times depending on design specifications and parameters for the device. As with other design structure types described herein, netlist 680 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 610 may include hardware and software modules for processing a variety of input data structure types including netlist 680. Such data structure types may reside, for example, within library elements 630 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 640, characterization data 650, verification data 660, design rules 670, and test data files 685 which may include input test patterns, output test results, and other testing information. Design process 610 may further include modules for performing standard circuit design processes such as timing analysis, verification, design rule checking, place and route operations, etc.

Design process 610 employs and incorporates well-known logic and physical design tools such as HDL compilers and simulation model build tools to process design structure 620 together with some or all of the depicted supporting data structures to generate a second design structure 690. Similar to design structure 620, design structure 690 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5. In one embodiment, design structure 690 may comprise a compiled, executable HDL simulation model that functionally simulates the devices shown in FIGS. 1-5.

Design structure 690 may also employ a data format used for the exchange of layout data of integrated circuits and/or symbolic data format (e.g. information stored in a GDSII (GDS2), GL1, OASIS, map files, or any other suitable format for storing such design data structures). Design structure 690 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 1-5. Design structure 690 may then proceed to a stage 695 where, for example, design structure 690 proceeds to tape-out, is released to manufacturing, is released to a mask house, is sent to another design house, is sent back to the customer, etc.

Again, the design structures processed and/or generated by design flow 600 may be encoded on machine-readable (i.e., computer readable) transmission or storage media. Therefore, as will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A memory array, comprising:
   a plurality of global bit lines, wherein each bit line is coupled to a plurality of memory cells;
   a plurality of precharge logic, wherein each precharge logic is coupled to an associated global bit line in the plurality of global bit lines;
   identification logic coupled to the plurality of precharge logic, wherein the identification logic provides a precharge enable signal that enables a subset of the plurality of precharge logic to precharge its associated subset of the plurality of global bit lines to a voltage level of a voltage source and wherein the identification logic sends the precharge enable signal to the subset of the plurality of precharge logic on each clock cycle, thereby reducing the power consumption of the memory array;
   a NAND gate between the identification logic and each of the plurality of precharge logic, wherein a first input to the NAND gate is coupled to the identification logic via a first latching mechanism, wherein a second input to the NAND gate is coupled to a local clock signal, wherein an output of the NAND gate is coupled to each precharge logic, wherein the first latching mechanism, when activated by the identification logic, provides the precharge enable signal to the NAND gate, and wherein the first latching mechanism provides a scanable boundary in front of the plurality of memory cells; and a NOR gate coupled between each global bit line and an output device, wherein a first input to the NOR gate is coupled to the global bit line, wherein a second input to the NOR gate is coupled to the identification logic via a second latching mechanism, wherein an output of the NOR gate is coupled to the output device, and wherein the second latching mechanism, when activated by the identification logic, provides the precharge enable signal to the NOR gate.

2. The memory array of claim 1, wherein the precharge logic is enabled when the precharge enable signal from the identification logic is active and the local clock signal is active.

3. The memory array of claim 1, wherein the output device receives an active signal from the NOR gate when the precharge enable signal from the identification logic is not active and the global bit line is discharged.

4. The memory array of claim 1, wherein the output device receives a non-active signal from the NOR gate when the precharge enable signal from the identification logic is active, when the global bit line is charged, or when the precharge enable signal from the identification logic is active and the global bit line is charged and wherein by receiving the non-active signal the global bit line is not selected by the output device and the global bit line is in a state for precharging.

5. An integrated chip, comprising:
a memory array, wherein the memory array comprises:
a plurality of global bit lines, wherein each bit line is coupled to a plurality of memory cells;
a plurality of precharge logic, wherein each precharge logic is coupled to an associated global bit line in the plurality of global bit lines;
identification logic coupled to the plurality of precharge logic, wherein the identification logic provides a precharge enable signal that enables a subset of the plurality of precharge logic to precharge its associated subset of the plurality of global bit lines to a voltage level of a voltage source and wherein the identification logic sends the precharge enable signal to the subset of the plurality of precharge logic on each clock cycle, thereby reducing the power consumption of the memory array;
a NAND gate between the identification logic and each of the plurality of precharge logic, wherein a first input to the NAND gate is coupled to the identification logic via a first latching mechanism, wherein a second input to the NAND gate is coupled to a local clock signal, wherein an output of the NAND gate is coupled to each precharge logic, wherein the first latching mechanism, when activated by the identification logic, provides the precharge enable signal to the NAND gate, and wherein the first latching mechanism provides a scanable boundary in front of the plurality of memory cells; and
a NOR gate coupled between each global bit line and an output device, wherein a first input to the NOR gate is coupled to the global bit line, wherein a second input to the NOR gate is coupled to the identification logic via a second latching mechanism, wherein an output of the NOR gate is coupled to the output device, and wherein the second latching mechanism, when activated by the identification logic, provides the precharge enable signal to the NOR gate.

6. The integrated chip of claim 5, wherein the precharge logic is enabled when the precharge enable signal from the identification logic is active and the local clock signal is active.

7. The integrated chip of claim 5, wherein the output device receives an active signal from the NOR gate when the precharge enable signal from the identification logic is not active and the global bit line is discharged.

8. The integrated chip of claim 5, wherein the output device receives a non-active signal from the NOR gate when the precharge enable signal from the identification logic is active, when the global bit line is charged, or when the precharge enable signal from the identification logic is active and the global bit line is charged and wherein by receiving the non-active signal the global bit line is not selected by the output device and the global bit line is in a state for precharging.

9. A data processing system, comprising:
a processor; and
a memory coupled to the processor, wherein the memory comprises a memory array and wherein the memory array comprises:
a plurality of global bit lines, wherein each bit line is coupled to a plurality of memory cells;
a plurality of precharge logic, wherein each precharge logic is coupled to an associated global bit line in the plurality of global bit lines;
identification logic coupled to the plurality of precharge logic, wherein the identification logic provides a precharge enable signal that enables a subset of the plurality of precharge logic to precharge its associated subset of the plurality of global bit lines to a voltage level of a voltage source and wherein the identification logic only sends the precharge enable signal to the subset of the plurality of precharge logic on each clock cycle, thereby reducing the power consumption of the memory array;
a NAND gate between the identification logic and each of the plurality of precharge logic, wherein a first input to the NAND gate is coupled to the identification logic via a first latching mechanism, wherein a second input to the NAND gate is coupled to a local clock signal, wherein an output of the NAND gate is coupled to each precharge logic, wherein the first latching mechanism, when activated by the identification logic, provides the precharge enable signal to the NAND gate, and wherein the first latching mechanism provides a scanable boundary in front of the plurality of memory cells; and
a NOR gate coupled between each global bit line and an output device, wherein a first input to the NOR gate is coupled to the global bit line, wherein a second input to the NOR gate is coupled to the identification logic via a second latching mechanism, wherein an output of the NOR gate is coupled to the output device, and wherein the second latching mechanism, when activated by the identification logic, provides the precharge enable signal to the NOR gate.

10. The data processing system of claim 9, wherein the precharge logic is enabled when the precharge enable signal from the identification logic is active and the local clock signal is active.

11. The data processing system of claim 9, wherein the output device receives an active signal from the NOR gate when the precharge enable signal from the identification logic is not active and the global bit line is discharged.

12. The data processing system of claim 9, wherein the output device receives a non-active signal from the NOR gate when the precharge enable signal from the identification logic is active, when the global bit line is charged, or when the precharge enable signal from the identification logic is active and the global bit line is charged and wherein by receiving the non-active signal the global bit line is not selected by the output device and the global bit line is in a state for precharging.

13. The method of claim 1, wherein the first latching mechanism provides a precharge suppression for the set of memory cells.

14. The method of claim 1, wherein the second latching mechanism is a slave latch to the first latching mechanism and wherein the second latching mechanism provides storage of a predicted value constant thought a time where access to the set of memory cells is evaluated.

15. The integrated chip of claim 5, wherein the first latching mechanism provides a precharge suppression for the set of memory cells.

16. The integrated chip of claim 5, wherein the second latching mechanism is a slave latch to the first latching mechanism and wherein the second latching mechanism provides storage of a predicted value constant thought a time where access to the set of memory cells is evaluated.

17. The data processing system of claim 9, wherein the first latching mechanism provides a precharge suppression for the set of memory cells.

18. The data processing system of claim 9, wherein the second latching mechanism is a slave latch to the first latching mechanism and wherein the second latching mechanism provides storage of a predicted value constant thought a time where access to the set of memory cells is evaluated.

\* \* \* \* \*